(12) United States Patent
Zhang

(10) Patent No.: US 12,026,073 B2
(45) Date of Patent: Jul. 2, 2024

(54) METHOD AND SYSTEM FOR REPAIRING MEMORY DEVICE

(71) Applicant: CHANGXIN MEMORY TECHNOLOGIES, INC., Hefei (CN)

(72) Inventor: Liang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 374 days.

(21) Appl. No.: 17/404,119

(22) Filed: Aug. 17, 2021

(65) Prior Publication Data

US 2022/0300388 A1    Sep. 22, 2022

Related U.S. Application Data

(63) Continuation of application No. PCT/CN2021/103481, filed on Jun. 30, 2021.

(30) Foreign Application Priority Data

Mar. 19, 2021  (CN) .......................... 202110295405.2

(51) Int. Cl.
G06F 11/00 (2006.01)
G06F 3/06 (2006.01)
G06F 11/20 (2006.01)

(52) U.S. Cl.
CPC ........ G06F 11/2094 (2013.01); G06F 3/0619 (2013.01); G06F 3/0653 (2013.01); G06F 3/0673 (2013.01)

(58) Field of Classification Search
CPC ............. G06F 11/1068; G06F 11/1048; G06F 11/1072; G06F 11/2094
See application file for complete search history.

(56) References Cited

U.S. PATENT DOCUMENTS 9,165,679 B2 * 10/2015 Oh ........................ G11C 29/808
10,443,531 B2 * 10/2019 Morzano ............. G11C 29/027
(Continued)

FOREIGN PATENT DOCUMENTS

CN        101329918 A      12/2008
CN        102237132 A      11/2011
(Continued)

OTHER PUBLICATIONS

Supplementary European Search Report in European application No. 21772941.7, mailed on Sep. 9, 2022, 8 pgs.
(Continued)

*Primary Examiner* — Charles Ehne
(74) *Attorney, Agent, or Firm* — Kilpatrick Townsend & Stockton LLP

(57) ABSTRACT

A method for repairing a memory device includes: performing error detection on memory units of the memory device; temporarily storing each of unit addresses of detected error units in registers until the number of the detected error units reaches a first preset number, where the detected error units are damaged memory units, and each of the detected error unit occupies a respective one of the registers, and each of the unit addresses comprises a row address; successively selecting one of the registers as a target register; determining whether a row addresses in the target register exists in a reference storage module, where a repaired row address or an unrepaired row address is stored in the reference storage module; and repairing error units that are not repaired through the row addresses according to a result of the determination.

16 Claims, 4 Drawing Sheets

(56) References Cited

U.S. PATENT DOCUMENTS

| | | | |
|---|---|---|---|
| 10,497,460 B2 | 12/2019 | Kim et al. | |
| 2002/0196687 A1* | 12/2002 | Sauvageau | G11C 29/808 365/200 |
| 2005/0160310 A1 | 7/2005 | Ellis | |
| 2017/0110206 A1 | 4/2017 | Ryu et al. | |
| 2019/0096508 A1 | 3/2019 | Kim et al. | |
| 2019/0325982 A1 | 10/2019 | Woo | |
| 2020/0327951 A1 | 10/2020 | Jung | |

FOREIGN PATENT DOCUMENTS

| | | |
|---|---|---|
| CN | 102420016 A | 4/2012 |
| CN | 102592680 A | 7/2012 |
| CN | 103578562 B | 11/2016 |
| CN | 109726141 A | 5/2019 |

OTHER PUBLICATIONS

International Search Report in the international application No. PCT/CN2021/103481, mailed on Dec. 15, 2021, 2 pgs.

* cited by examiner

METHOD AND SYSTEM FOR REPAIRING MEMORY DEVICE

CROSS-REFERENCE TO RELATED APPLICATIONS

This is a continuation of International Application No. PCT/CN2021/103481, filed on Jun. 30, 2021, and entitled "Method and System for Repairing Memory Device", which claims priority to Chinese patent application No. 202110295405.2, filed on Mar. 19, 2021 and entitled "Method and System for Repairing Memory Device". The disclosures of International Application No. PCT/CN2021/103481 and Chinese patent application No. 202110295405.2 are hereby incorporated by reference in their entireties.

TECHNICAL FIELD

The disclosure relates to the field of semiconductor technologies, and more particularly, to a method and a system for repairing a memory device.

BACKGROUND

During a repair of a memory device, in order to improve the detection efficiency, a plurality of stored error units are usually repaired in a unified manner after storing unit addresses of the plurality of error units. Thus, when repairing, the plurality of error units may be repaired at one time, thereby improving the repairing efficiency.

However, during an actual repairing process, there may be a repairing failure phenomenon when applying this repairing method.

SUMMARY

A first aspect of the disclosure provides a method for repairing a memory device, including the following operations.

Error detection is performed on memory units of the memory device.

Each of unit addresses of detected error units is temporarily stored in registers until the number of the detected error units reaches a first preset number, where the detected error units are damaged memory units, and each of the detected error units occupies a respective one of the registers, and each of the unit addresses includes a row address.

One of the registers is successively selected as a target register.

It is determined whether a row address in the target register exists in a reference storage module, where a repaired row address or an unrepaired row address is stored in the reference storage module.

Error units that are not repaired through the row address are repaired according to a result of the determination.

A second aspect of the disclosure provides a system for repairing a memory device, including a detection circuit, a register circuit, a control circuit, a reference storage circuit, a first judgment circuit and a repairing circuit.

The detection circuit is configured to perform error detection on the memory units of the memory device and output the unit addresses of the error units, and the error units are the damaged memory units.

The register circuit is electrically connected with the detection circuit and includes a number of registers, the number being not less than a first preset number, where a respective one of the registers is configured to receive a unit address of each of the error units and output a row address of each of the error units, each of the error units occupies the respective one of the registers, and each of the unit addresses includes a row address.

The control circuit is electrically connected with the registers and configured to successively one of the registers, as a target register, in response to that the number of the error units detected by the detection circuit reaches the first preset number.

A reference storage circuit is configured to store and output a repaired row address or an unrepaired row address.

A first determination circuit is electrically connected with the reference storage circuit and the register circuit, where the first determination circuit is configured to receive a row address output by the target register and a row address output by the reference storage circuit, to determine whether the row address in the target register exists in the reference storage circuit, and the first determination circuit is further configured to output a result of the determination.

A repairing circuit is electrically connected with the first determination circuit, and configured to repair error units that are not repaired through the row address according to the result of the determination.

According to the method and the system for repairing the memory device, when the unit addresses of the plurality of error units are uniformly repaired, the unit addresses of the error units may firstly be stored in different registers. It may be determined whether the address in each of the resisters exists in the reference storage circuit, and then it may be determined whether the address of the error unit corresponding to each of the registers is repaired or not. Thus, only the error unit that is not repaired through the row address can be repaired.

Therefore, even if there are different error units during a same repairing process, and the different error units appear on the same word line of the same bank, the word line will not be repeatedly repaired, thereby effectively avoiding the repairing failure.

BRIEF DESCRIPTION OF THE DRAWINGS

In order to better clarify the technical solution of embodiments of the disclosure or the conventional technology, the drawings required to illustrate the embodiments or the conventional technology will be simply described blow. It is apparent that the drawings described below merely illustrate some embodiments of the disclosure. Those of ordinary skill in the art can obtain other drawings without creative labor on the basis of those drawings.

DETAILED DESCRIPTION

Figure 1:
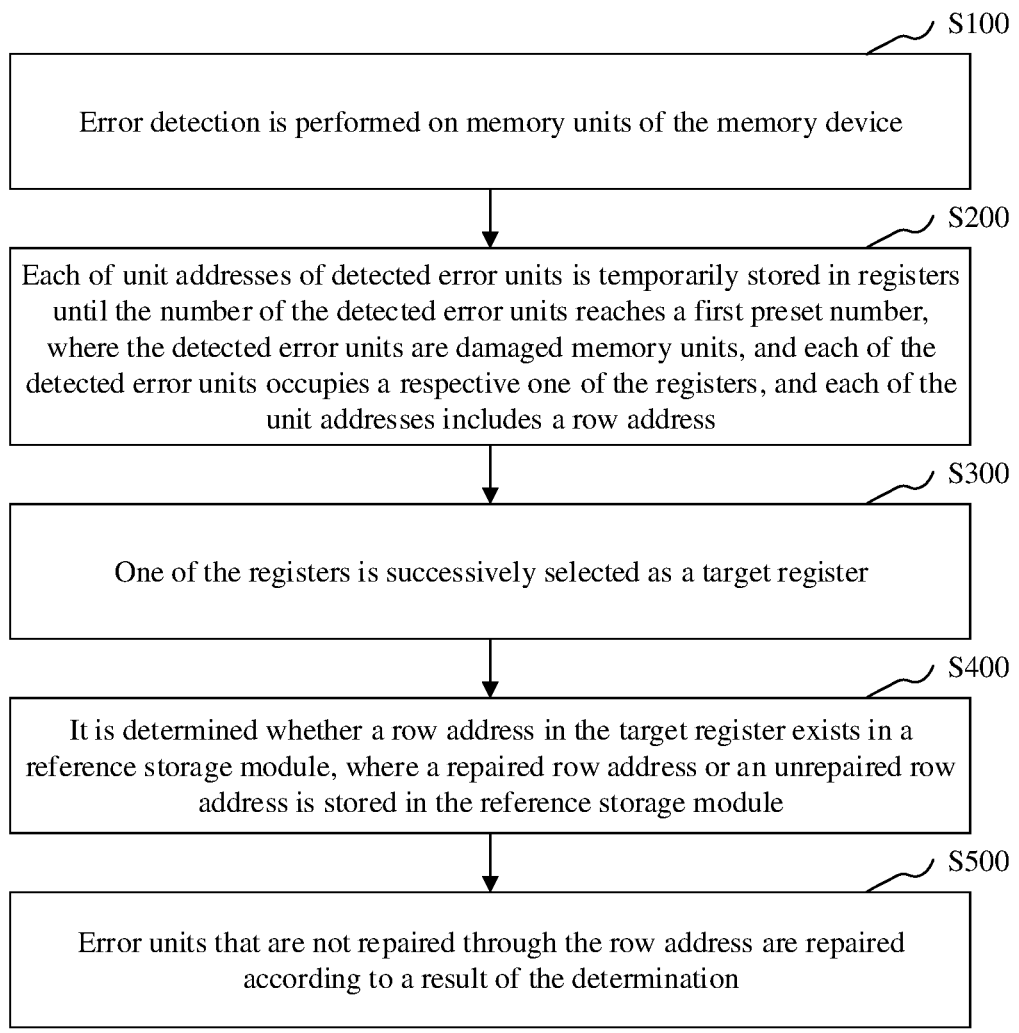
FIG. 1 is a flow chart of a method for repairing a memory device according to one embodiment of the disclosure.
Figure 2:
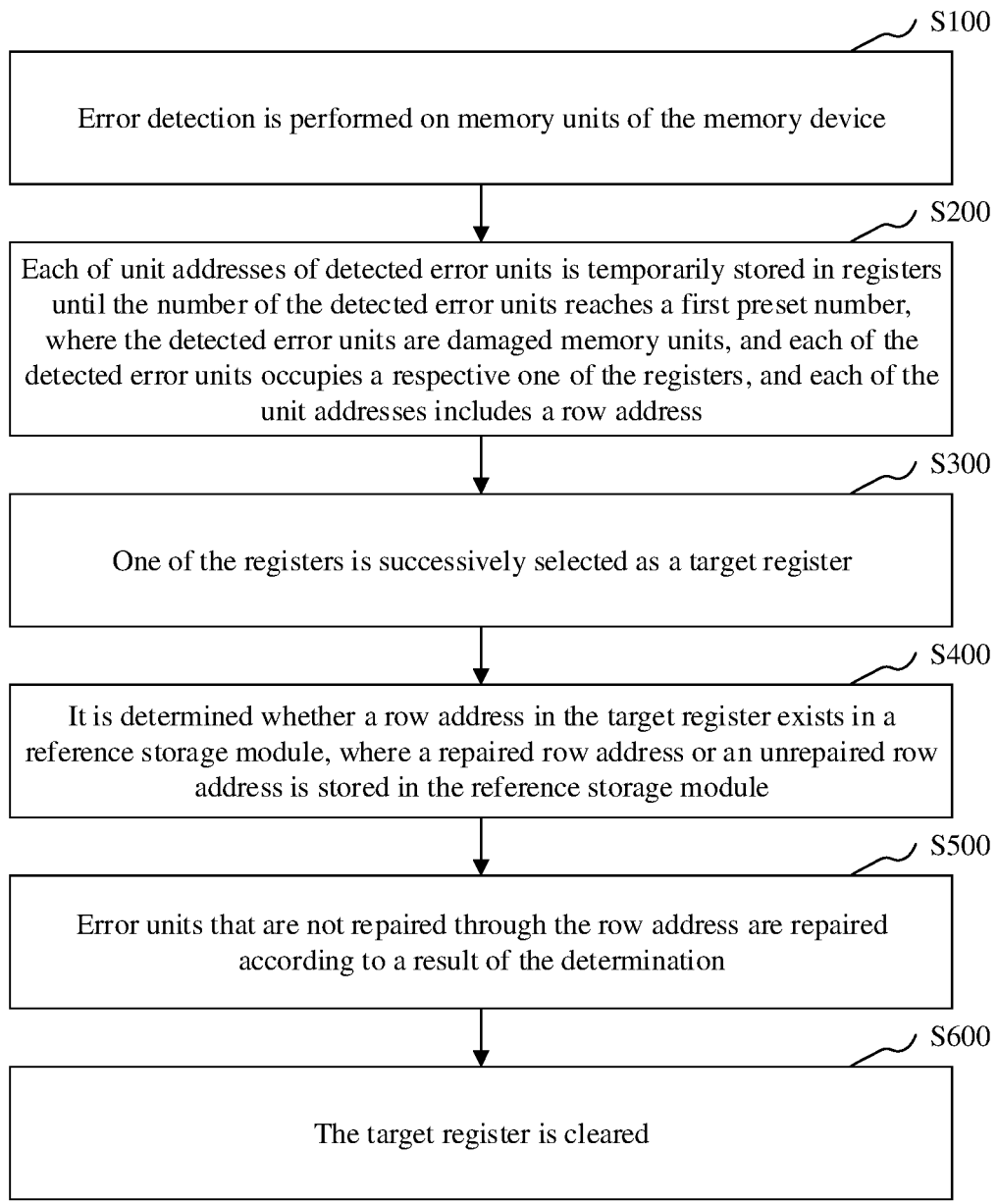
FIG. 2 is a flow chart of a method for repairing a memory device according to another embodiment of the disclosure.
Figure 3:
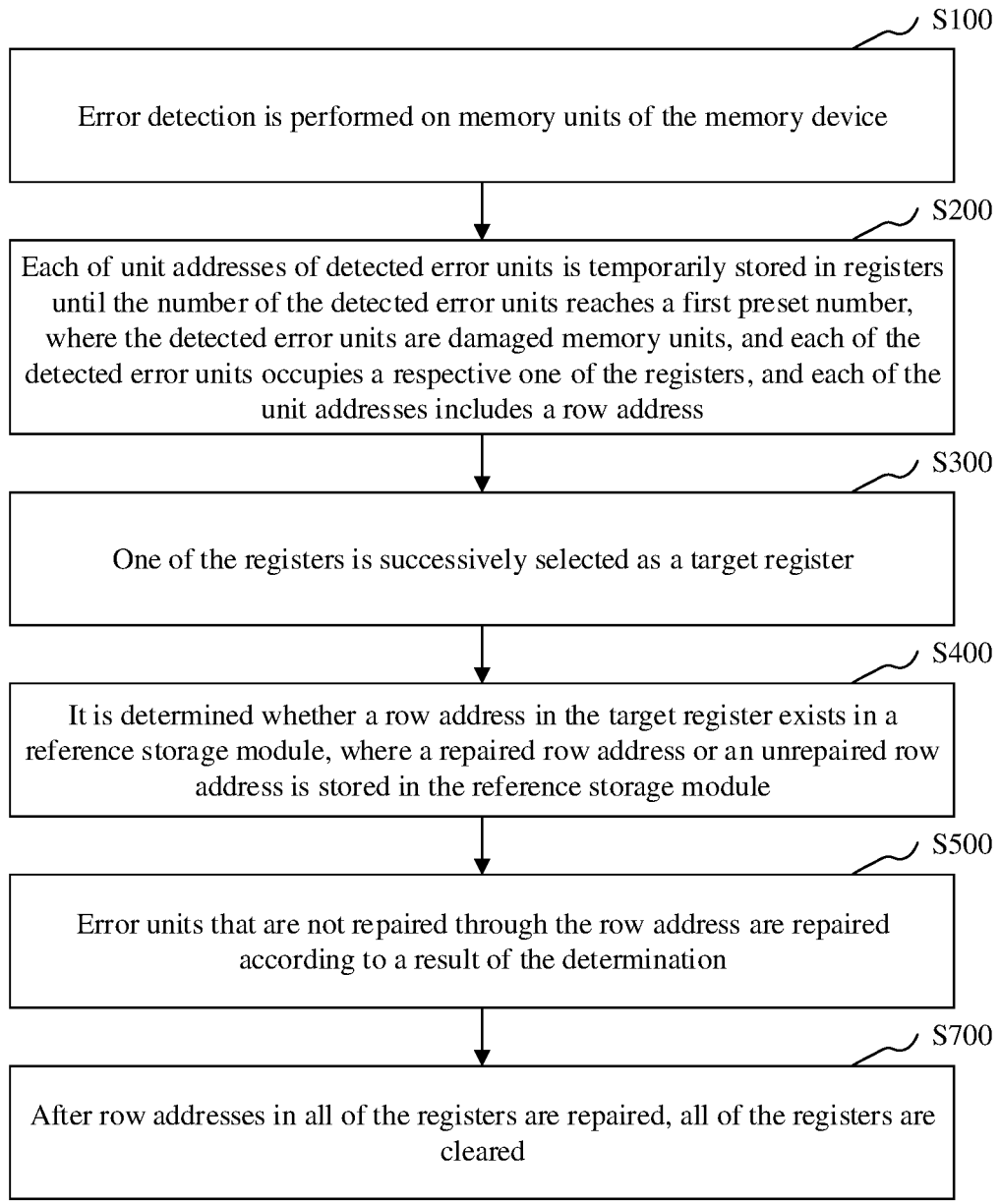
FIG. 3 is a flow chart of a method for repairing a memory device according to another embodiment of the disclosure.

In order to facilitate the understanding of the disclosure, the disclosure will be described more comprehensively below with reference to the related drawings. The drawings show preferred embodiments of the disclosure. However, the disclosure may be implemented in various forms and is not limited to the embodiments described herein. On the contrary, these embodiments are provided to make the understanding of the disclosure more thorough and comprehensive.

Unless otherwise defined, all technical and scientific terms used herein have the same meanings as commonly understood by those skilled in the art of the disclosure. Terms used in the description of the disclosure herein are only for the purpose of describing specific embodiments, and not intended to limit the disclosure.

It should be understood that when an element or a layer is referred to as being "above", "adjacent to", "connected with", or "coupled to" other elements or layers, it may be referred to that the element or layer is directly above, adjacent to, connected with or coupled to the other elements or layers, or there may be an intermediate element or layer. On the contrary, when an element is referred to as being "directly on", "directly adjacent to", "directly connected with" or "directly coupled to" other elements or layers, there may be no an intermediate element or layer. It should be understood that, although various elements, components, regions, layers, doped types and/or parts are described with terms of first, second, third, etc., these elements, components, regions, layers, doped types and/or parts should not be limited to these terms. These terms are used only to distinguish one element, component, region, layer, doped layer or part from another element, component, region, layer, doped type or part. Therefore, a first element, a first component, a first region, a first layer, a first doped type or a first part discussed below may be represented as a second element, a second component, a second region, a second layer or a second part without departing from the teaching of the disclosure. For example, a first determination module may become a second determination module; and similarly, the second determination module may become the first determination module, and the first determination module and the second determination module may be different determination modules.

As used herein, singular forms "a/an", "one", and "the" are also intended to include the plural forms, unless otherwise specified in the context. It is also to be understood that, when terms of "composed of" and/or "including" are used in this description, a presence of features, integers, steps, operations, elements, and/or components can be determined, but a presence or addition of one or more other features, integers, steps, operations, elements, components, and/or groups may also be possible. As used herein, the term of "and/or" may include any and all combinations of the related listed items.

It should be noted that, when one element is regarded as being "connected" to another element, the element may be directly connected with another element, or connected with another element through an intermediate element. In addition, if the connected objects have electric signals or data delivery, "connection" in the embodiments below should be understood as "electric connection", "communication connection", etc.

As described in the background, during the repair of the memory device, in order to improve the detection efficiency, the plurality of stored error units are usually repaired in the unified manner after storing the unit addresses of the plurality of error units. Thus, when repairing, the plurality of error units may be repaired at one time, thereby improving the repairing efficiency. However, during the actual repairing process, there will be the repairing failure phenomenon when applying this repairing method.

Through research, the inventors have found that one of the reasons causing the repairing failure phenomenon may be: when different error units appear on a same word line of a same bank, the same word line will be repeatedly repaired for several times, thereby causing a failure of the whole repairing. For example, if two detected error units appearing on the same word line are not identified, a row address A of the word line will be stored in two row repairing fuses which correspond to two redundant word lines. During a reading/writing process, if a reading/writing address is A, the two redundant word lines will be opened at the same time, and a reading/writing error may occur.

Based on the abovementioned reason, a method and a system for repairing a memory device are provided in the disclosure. The method and the system for repairing the memory device provided in the disclosure may be configured to repair a memory device with at least two error units appearing on a same word line.

In one embodiment of the disclosure, referring to FIG. 1, a method for repairing a memory device is provided, including the following steps of S100 to S500.

In the step of S100, error detection is performed on memory units of the memory device.

In the step of S200, each of unit addresses of detected error units is temporarily stored in registers until the number of the detected error units reaches a first preset number, where the detected error units are damaged memory units, and each of the detected error units occupies a respective one of the registers, and each of the unit addresses includes a row address;

In the step of S300, one of the registers is successively selected as a target register.

In the step of S400, it is determined whether a row address in the target register exists in a reference storage module, where a repaired row address or an unrepaired row address is stored in the reference storage module.

In the step of S500, error units that are not repaired through the row address are repaired according to a result of the determination.

In the step of S100, the memory device may include a plurality of memory units arranged in rows and in columns. At the same time, the memory device may include a plurality of word lines, and each of the word lines may provide a grid voltage to the plurality of the memory units arranged in the same row, so as to control the reading and writing of data performed on the memory units.

Each of the memory units may store data 0 or data 1, when the memory units are damaged, the data cannot be normally read and written.

Error detection may be performed the memory units of the memory device, namely, it is detected whether each of the memory units of the memory device is damaged or not.

In the step of S200, when one error unit is detected, a unit address of the error unit may be temporarily stored in one register. A unit address of one error unit may occupy one register, and unit addresses of different error units may be temporarily stored in different registers. When the number of the detected error units reaches a first preset number, the detection may be stopped.

The first preset number may be arranged according to actual needs, and the first preset number may be arranged to be the same as the number of the registers in the repairing system used for repairing.

In the step of S300, one of the registers may be selected as the target register. The target register may be the register that stores a unit address of a memory unit to be repaired. The row address in the target register may be a row address to be repaired.

In the step of S400, the reference storage module may store the repaired row address, or the reference storage module may store the unrepaired row address.

The repaired row addresses may be a row address of a memory unit with a repaired row address. The unrepaired row address may be a row address of a memory unit without a repaired row address.

By determining whether the row address in the target register exists in the reference storage module, it may be determined whether the row address of the error unit corresponding to the target register is repaired or not.

In the step of S500, if the reference storage module has stored the repaired row address, in response to that the result of the determination is that the row address in the target register exists in the reference storage module, the error unit corresponding to the target register may not be repaired. In response to that the result of the determination is that the row address in the target register does not exist in the reference storage module, the error unit corresponding to the target register may be repaired.

If the reference storage module stores the unrepaired row address, in response to that the result of the determination is that the row address in the target register exists in the reference storage module, the error unit corresponding to the target register may be repaired. In response to that the result of the determination is that the row address in the target register does not exist in the reference storage module, the error unit corresponding to the target register may not be repaired.

In this embodiment, when the unit addresses of the plurality of error units are uniformly repaired, the unit addresses of the error units may firstly be stored in different registers. It may be determined whether the address in each of the resisters exists in the reference storage module, and then it may be determined whether the address of the error unit corresponding to each of the registers is repaired or not. Thus, only the error unit that is not repaired through the row address can be repaired.

Therefore, even if there are different error units during a same repairing process, and the different error units appear on the same word line of the same bank, the word line will not be repeatedly repaired, thereby effectively avoiding the repairing failure.

It should be understood that the row address stored in the reference storage module may be gradually changed during the repairing process. If the repaired row address is stored in the reference storage module, in response to that a row address of one error unit has been repaired, the row address of the error unit may be stored in the reference storage module. If the unrepaired row address is stored in the reference storage module, in response to that the row address of the error unit is repaired, the row address of the error unit may be removed from the reference storage module.

In one embodiment of the disclosure, the reference storage module may store the repaired row address. At this time, before repairing, storage may not be performed in the reference storage module. During the repairing process, the row address stored in the reference storage module may be gradually increased, thereby effectively reducing system memory and improving a repairing efficiency.

At this time, the step of S500 may include the following operations of S510 and S520.

In the step of S510, in response to that the row addresses in the target register are stored in the reference storage module, the repairing of the error unit corresponding to the target register may be skipped.

The repairing of the error units corresponding to the target registers may be skipped to skip the current target register and perform the selection and determination of a next target register.

Further, the step of S500 may further include the following operation.

In the step of S520, in response to that the raw address in the target register does not exist in the reference storage module, the error unit corresponding to the target register may be repaired.

In one embodiment of the disclosure, the memory device may include a row repairing unit. The row repairing unit may be a circuit unit for repairing the row address of the error units and the row repairing unit may include a second preset number of row repairing fuses. The second preset number may be arranged according to the actual needs.

The row repairing fuses may be configured to receive and store the row address of the error unit. One row repairing fuse may correspond to one redundant row address, and one redundant row address may correspond to one redundant word line.

When a row address A1 of one error unit C1 is stored to one row repairing fuse F1, a word line W1 corresponding to the error unit C1 may be replaced by a redundant word line WF1 corresponding to the row repairing fuse F1, thereby completing the row address repairing of the error unit C1.

Hereafter, when reading and writing the memory device, in response to that the row address of the read/written memory unit is A1, the redundant word line WF1 may be opened, and the word line W1 may be closed.

At this time, the step of S520 may include a step of S522 that: the row address in the target register may be stored in one blank row repairing fuse of the row repairing unit.

The raw address of the target address may be the raw address of the error unit corresponding to the register, the row address may be stored to one blank row repairing fuse of the row repairing unit, so that repairing for the row address of the error unit corresponding to the register may be completed.

It should be understood that "blank row repairing fuse" may be the row repairing fuse of the row address not storing the memory unit.

In one embodiment of the disclosure, the reference storage module may include a row repairing unit. During the repairing process, the row repairing unit may store the row address of the error unit, so that the reference storage module can include the row repairing unit. On the one hand, the row repairing unit may be configured to repair the row address of the error unit; and on the other hand, the row repairing unit may be configured to determine whether the error unit to be repaired performs the row address repairing, thereby effectively using the row repairing unit and saving storage space of a system.

Moreover, the row address of the error unit does not need to be stored separately, thereby effectively improving a repairing efficiency.

In addition, in some embodiments of the disclosure, before the step of S522, the method may further include the following steps of S521 to S523.

In the step of S521, the row repairing unit may determine whether there is a blank row repairing fuse.

In response to that the row repairing unit has a blank repairing fuse, the step of S522 may be performed, where the row address in the target register may be stored in one blank row repairing fuse of the row repairing unit.

In addition, the unit address stored in the register may further include a column address.

At this time, in response to that the row repairing unit does not have the blank row repairing fuse, a step of S523 may be performed, where a column address of the error unit corresponding to the target register may be repaired.

The column address repairing may be implemented through a column repairing fuse. Similar to the foregoing row address repairing (in the step of S522), the column address repairing may be implemented through the row repairing fuse.

In one embodiment of the disclosure, after the step of S500, the method may further include the following step of S600.

In the step of S600, the target register is cleared.

That is, after completing a related processing of a target register, the target register may be cleared. When each of the all registers is successively selected as the target register and the related processing is performed, all the registers may be cleared. After one repairing processing is completed, all the registers can be cleared, so that the registers may be used for a next repairing again.

Therefore, this embodiment may effectively improve the utilization rate of the registers.

In this embodiment, a register may be cleared after being applied, which will certainly not be limit in the disclosure.

In another embodiment of the disclosure, after the step of S500, the method may further include the following step of S700.

In the step of S700, after row addresses in all of the registers are repaired, all of the registers are cleared.

Specifically, when the row address in one register is not repaired, the row address may be repaired, thereby completing the repairing for the row address in the register.

However, when the row address in one register is repaired, the repairing for the row address in the register may be completed, and the register will not be repaired again.

In one repairing process of this embodiment, after all the registers are applied, the registers are uniformly cleared. At this time, the registers may be used for the next repairing again, thereby effectively improving the utilization rate of the registers.

It should be understood that although various steps in the flow chart of FIG. 1 are successively displayed according to the indication of an arrow, these steps are not certainly performed according to the order indicated by the arrow. Unless otherwise stated herein, the implementation of these steps has no strict order limitation, and these steps may be performed according to another order. Moreover, at least part of the steps in FIG. 1 may include a plurality of steps or a plurality of stages. These steps or stages are not certainly competed at the same time, and performed at different times. The implementation order of these steps or stages is not certainly carried in turn, and in turn or alternatively performed together with at least part of the steps or stages in other steps or stages.

In one embodiment of the disclosure, a system for repairing the memory device is further provided, which includes a detection module 100, a register module 200, a control module 300, a reference storage module 400, a first determination module 500 and a repairing module 600.

The detection module 100 is configured to perform error detection on the memory units of the memory device and output unit addresses of error units, and the error units are the damaged memory units.

The register module 200 is electrically connected with the detection module 100 and includes a number of registers 210, the number being not less than a first preset number.

Specifically, the number of the registers 210 may be the same as the first preset number, thereby improving the utilization rate of the registers.

A respective one of the registers 210 is configured to receive and temporarily store a unit address of each of the error units and output a row address in the unit address of each of the error units, each of the error units occupies a respective one of the registers, and each of the unit addresses includes a row address.

The control module 300 is electrically connected with the registers 210 and configured to successively select one of the registers, as a target register, in response to that the number of the error units detected by the detection module 100 reaches the first preset number.

The reference storage module 400 is configured to store and output a repaired row addresses or an unrepaired row address.

The first determination module 500 is electrically connected with the reference storage module 400 and the register module 200, configured to receive a row address output by the target register 210 and a row address output by the reference storage module 400, to determine whether the row address in the target register exists in the reference storage module. And the first determination module 500 is further configured to output a result of the determination.

As an example, the control module 300 may include switch units 310 with the same number as the registers 210 in the register module 200. The first determination module 500 may be correspondingly and electrically connected with a respective one of the registers 210 through each of the switch units 310 of the control module 300. When a corresponding switch unit in the control module 300 is conducted, the first determination module 500 may be connected with the target register.

Figure 4:
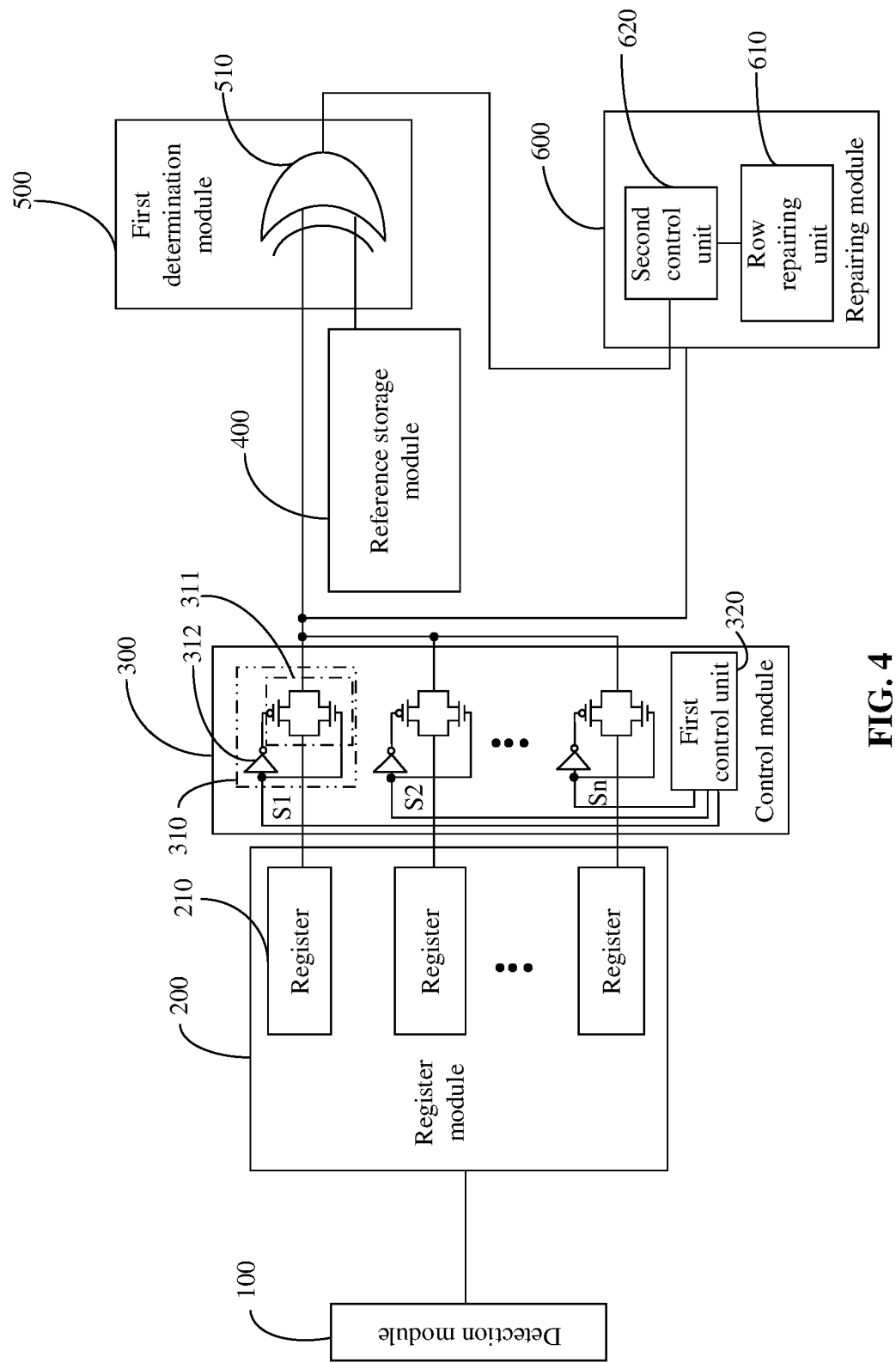
FIG. 4 is a schematic diagram of a module structure of a system for repairing a memory device according to one embodiment of the disclosure.

Specifically, referring to FIG. 4, the control module 300 may include a first control unit 320 and n switch units 310, each of the switch units 310 may correspond to a respective one of the registers 210, and n is a positive integer greater than 1.

The first control unit 320 may respectively input control signals S1-Sn to the n switch units 310. Herein, a control signal input by the first control unit 320 to a kth switch unit 310 may be Sk, and k is greater than or equal to 1, or less than or equal to n. Moreover, in response to any one of the control signals S1-Sn being a high-level signal, remaining control signals may be low-level signals.

In response to the detection module 100 detecting that the number of the detected error units reaches the first preset number, the control signals S1-Sn controlled by the first control unit 320 may be successively high-level signals, and then a first switch unit to a nth switch unit are opened in an opening order, so that each of the registers corresponding to the first switch unit to the nth switch unit may successively become the target register, and the target register may be connected with the first determination module 500.

More specifically, as an example, each of the switch units 310 may include a transmission gate 311 and an inverter 312. The transmission gate 311 may be composed of a P-channel Metal Oxide Semiconductor (PMOS) tube and an N-channel Metal Oxide Semiconductor (NMOS) tube. The control signals of the first control unit 320 may be accessed into a gate end of the NMOS tube and an input end of the inverter 312, at the same time, an output end of the inverter 312 may be connected with a gate end of the PMOS tube.

The manner in which the first control unit 320 controls the opening of the kth switch unit may be as the following.

The control signal Sk input by the first control unit 320 to the kth switch unit 310 may be a high-level signal, and the NMOS tube may receive the high-level signal. At the same time, the inverter 312 may receive the high-level signal, and the high-level signal may be converted into a low-level signal and output to the PMOS tube. Therefore, at least one of the NMOS tube or the PMOS tube can be conducted at this time, thereby opening the switch unit 310.

When the control signal Sk input by the first control unit 320 to the kth switch unit 310 is a low-level signal, the NMOS tube may receive the low-level signal. At the same time, the inverter 312 may receive the low-level signal, and the low-level signal may be converted into a high-level signal and output to the PMOS tube. Therefore, at least one of the NMOS tube or the PMOS tube can be conducted at this time, thereby disconnecting the switch unit 310.

The repairing module 600 is electrically connected with the first determination module 500 and configured to repair error units that are not repaired through the row address according to the result of the determination.

In this embodiment, under the control of the control module 300, the first determination module 500 may successively determine whether the row addresses of the error unit to be repaired that stored in each of the registers is stored in the reference storage module 400. And then, it may be determined whether the row address of the error unit corresponding to each of the registers is repaired or not. Thus, only the error unit that is not repaired through the row address can be repaired.

Therefore, even if there are different error units during a same repairing process, and the different error units appear on the same word line of the same bank, the word line will not be repeatedly repaired, thereby effectively avoiding the repairing failure.

In one embodiment of the disclosure, the reference storage module 400 may be configured to store the repaired row address. The repairing module 600 may be further configured to skip a repair of an error unit corresponding to the target register, in response to the row address in the target register existing in the reference storage module 400.

In one embodiment of the disclosure, based on the foregoing embodiments, the first determination module 500 may include a comparator 510, which may be configured to receive the row address output by the target register 210 and the row address output by the reference storage module 400, and compare the row address output by the target register 210 with the row address output by the reference storage module 400. In response to the row address output by the target register being not consistent with the row address output by the reference storage module, a preset level signal may be output to the repairing module 600 to open the repairing module 600.

As an example, the preset level signal may include a high-level signal.

If the row address output by the target register 210 is not consistent with the row address output by the reference storage module 400, it may be indicated that the error unit corresponding to the target register 210 has not been repaired through the row address. At this time, the comparator 510 may output a high-level signal to open the repairing module 600, and the error unit corresponding to the target register 210 may be repaired.

If the row address output by the target register 210 is consistent with the row address output by the reference storage module 400, it may be indicated that the error unit corresponding to the target register 210 has been repaired through the row address. At this time, the comparator 510 may output a low-level signal, and then the repairing module 600 may not be opened.

It should be understood that, when the reference storage module 400 stores a plurality of row addresses, the comparator 510 may successively compare whether the row address output by the target register 210 is consistent with each of the row addresses stored in the reference storage module 400.

In one embodiment of the disclosure, the repairing module 600 may include a row repairing unit 610 and a second control unit 620. The row repairing unit 610 may be electrically connected with the respective one of the registers 210 and configured to perform a row address repairing on the error unit corresponding to the target register. The second control unit 620 may be electrically connected with the comparator 510 and the row repairing unit 610, and configured to open/close the row repairing unit according to a high-level signal or a low-level signal output by the comparator 510.

As an example, the second control unit 620 may further include a switch transistor and other switch devices. When the high-level signal output by the comparator 510 is received, the switch transistor and other switch devices may be opened to open the row repairing unit 610, so as to perform the row address repairing on the error unit corresponding to the target register. When the low-level signal output by the comparator 510 is received, the switch transistor and other switch devices may be disconnected to close the row repairing unit 610, so as to skip the repairing on the error unit corresponding to the target register, or terminate this repairing process.

Specifically, together with the first determination module 500, the repairing module 600 may be correspondingly and electrically connected with the respective one of the registers 210 through each of the switch units 310 of the control module 300.

As an example, as described above, the control module 300 may include a first control unit 320 and n switch units 310, each of the switch units 310 may correspond to a respective one of the registers 210, and n is a positive integer greater than 1.

The first control unit 320 may respectively input control signals S1-Sn to the n switch units 310. Herein, a control signal input by the first control unit 320 to a kth switch unit 310 may be Sk, and k is greater than or equal to 1, or less than or equal to n. Moreover, in response to any one of the control signals S1-Sn being a high-level signal, remaining control signals may be low-level signals.

In response to the detection module 100 detecting that the number of the detected error units reaches the first preset number, the control signals S1-Sn controlled by the first control unit 320 may be successively high-level signals, and then a first switch unit to a nth switch unit are opened in an opening order, so that each of the registers corresponding to the first switch unit to the nth switch unit may successively become the target register.

For the target register, when becoming the target register, the corresponding switch unit 310 may be opened. Therefore, the row address in the target register may be transmitted to the first determination module 500 and the repairing module 600.

At this time, the comparator 510 of the first determination module 500 may directly obtain the row address in the target register, and compare the row address in the target register with the row address output by the reference storage module 400. And then, the level signal may be output according to a comparison result.

When the second control unit 620 is opened in response to the level signal output by the comparator 510 being a preset level signal, the row repairing unit 610 may receive and store the row address in the target register. And then, the row address in the target register may be stored in the row repairing unit 610 to be repaired.

In one embodiment of the disclosure, the row repairing unit 610 may include a second preset number of row repairing fuses. One row repairing fuse may correspond to one redundant row address. The row repairing unit 610 may be configured to store the row address in the target register to one blank row repairing fuse of the row repairing unit 610.

Further, at this time, the reference storage module 400 may include the row repairing unit 610.

In addition, in some embodiments of the disclosure, the system for repairing the memory device may further include a second determination module (not shown in the figure), and the second determination module may be configured to determine whether there is a blank row repairing fuse in the row repairing unit 610.

At this time, the second control unit 620 may open the row repairing unit 600, in response to that the row address of the target register does not exist in the reference storage module 400 and the row repairing unit 610 has a blank row repairing fuse.

At the same time, the unit address may further include a column address. The repairing module 600 may further include a column repairing unit (not shown in the figure), and the column repairing unit may be configured to repair a column address of the error unit corresponding to the target register.

The second control unit may open the column repairing unit in response to that the row address of the target register does not exist in the reference storage module and the row repairing unit has a blank row repairing fuse.

In one embodiment of the disclosure, a system for repairing the memory device is further provided, which includes a detection circuit, a register circuit, a control circuit, a reference storage circuit, a first determination circuit and a repairing circuit.

The detection circuit is configured to perform error detection on the memory units of the memory device and output unit addresses of error units, and the error units are damaged memory units.

The register circuit is electrically connected with the detection circuit and comprises a number of registers, the number being not less than a first preset number, wherein a respective one of the registers is configured to receive a unit address of each of the error units and output a row address of each of the error units, each of the error units occupies the respective one of the registers, and each of the unit addresses comprises a row address.

The control circuit is electrically connected with the registers and configured to successively select one of the registers, as a target register, in response to that the number of the error units detected by the detection circuit reaches the first preset number.

The reference storage circuit is configured to store and output a repaired row address or an unrepaired row address.

The first determination circuit is electrically connected with the reference storage circuit and the register circuit, where the first determination circuit is configured to receive a row address output by the target register and a row address output by the reference storage circuit, to determine whether the row address in the target register exists in the reference storage circuit, and the first determination circuit is further configured to output a result of the determination.

The repairing circuit is electrically connected with the first determination circuit, and configured to repair error units that are not repaired through the row address according to the result of the determination.

In one embodiment of the disclosure, the control circuit may include a first control unit and n switch units, each of the n switch units corresponding to the respective one of the registers, and n is a positive integer greater than 1. The first control unit respectively may input control signals S1-Sn to the n switch units, where a control signal input by the first control unit to a kth switch unit is Sk, and k is greater than or equal to 1, or less than or equal to n. And in response to any one of the control signals S1-Sn being a high-level signal, remaining control signals may be low-level signals. In response to the detection circuit detecting that the number of the detected error units reaches the first preset number, the control signals S1-Sn controlled by the first control unit may be successively high-level signals, and then a first switch unit to a nth switch unit may be opened in order, so that each of registers corresponding to the first switch unit to the nth switch unit successively can become the target register, the target register being connected with the first determination circuit.

In one embodiment of the disclosure, the reference storage circuit may be configured to store and output the repaired row address, and the repairing circuit may be further configured to skip a repair of an error unit corresponding to the target register, in response to the row address in the target register existing in the reference storage circuit.

In one embodiment of the disclosure, the first determination circuit may include a comparator, and the comparator may be configured to receive the row address output by the target register and the row address output by the reference storage circuit, and compare the row address output by the target register with the row address output by the reference storage circuit. In response to the row address output by the target register being not consistent with the row address output by the reference storage circuit, a preset level signal may be output to the repairing circuit to open the repairing circuit.

In one embodiment of the disclosure, the preset level signal may include a high-level signal.

In one embodiment of the disclosure, the repairing circuit may include a row repairing unit and a second control unit; the row repairing unit may be electrically connected with the respective one of the registers and configured to perform a row address repair on the error unit corresponding to the target register; and the second control unit may be electrically connected with the comparator and the row repairing unit, and configured to open/close the row repairing unit according to a high-level signal or a low-level signal output by the comparator.

In one embodiment of the disclosure, the row repairing unit may include a second preset number of row repairing fuses, each corresponding to one redundant row address, and the row repairing unit is configured to store the row address in the target register to one blank row repairing fuse of the row repairing unit.

In one embodiment of the disclosure, the system for repairing the memory device may be used for repairing a memory device in which at least two of the error units appear on a same word line.

Specific limitation about the system for repairing the memory device may refer to that of the aforementioned method for repairing the memory device, and details will not be made herein. Each module in the foregoing system for repairing the memory device may be implemented in whole or in part by software, hardware or a combination thereof. Each of the foregoing modules may be embedded in the form of hardware or independent of a processor in a computer device, or be stored in memory of the computer device in the form of software, so that the processor may call and execute operations corresponding to the foregoing modules. It should be noted that, in the embodiments of the disclosure, the division of the module is schematic, and is only a logic function division, and there may be other division forms in actual implementations.

Each technical feature of the abovementioned embodiments may be combined arbitrarily. For simplicity of the description, not all possible combinations of each technical solation in the abovementioned embodiments are described. However, any combination of these technical features shall fall within the scope recorded in the description without conflicting.

The abovementioned embodiments only express some implementations of the disclosure and their descriptions are relatively specific and detailed, but they should not be understood as limiting the scope of the disclosure. It should be pointed out that those of ordinary skill in the art may further make a plurality of modification and improvements without departing from the concept of the disclosure, and all of these fall within the scope of protection of the disclosure. Therefore, the protection scope of the present application should be subject to the appended claims.

The invention claimed is:

1. A method for repairing a memory device, comprising:
performing error detection on memory units of the memory device;
temporarily storing each of unit addresses of detected error units in registers until a number of the detected error units reaches a first preset number, wherein the detected error units are damaged memory units, each of the detected error units occupies a respective one of the registers, each of the registers corresponds to a respective switch unit, and each of the unit addresses comprises a row address;
successively selecting one of the registers, as a target register, comprising: in response to the number of the detected error units reaching the first preset number, controlling the first preset number of switch units corresponding to the first preset number of the detected error units to be opened in order, to enable registers corresponding to the first preset number of the switch units to successively become the target register;
determining whether a row address in the target register exists in a reference storage module, wherein a repaired row address or an unrepaired row address is stored in the reference storage module; and
repairing error units that are not repaired through the row address according to a result of the determination.

2. The method for repairing the memory device of claim 1, wherein the reference storage module stores the repaired row address, and repairing the error units that are not repaired through the row address according to the result of the determination comprises:
skipping a repair of an error unit corresponding to the target register, in response to the row address in the target register existing in the reference storage module.

3. The method for repairing the memory device of claim 2, wherein repairing the error units that are not repaired through the row address according to the result of the determination further comprises:
repairing the error unit corresponding to the target register, in response to the row address in the target register not existing in the reference storage module.

4. The method for repairing the memory device of claim 3, wherein
the memory device comprises a row repairing unit, the row repairing unit comprises a second preset number of row repairing fuses, each of the row repairing fuses corresponding to one redundant row address; and
wherein repairing the error unit corresponding to the target register, in response to the row address in the target register not existing in the reference storage module comprises:
storing the row address in the target register to one blank row repairing fuse of the row repairing unit.

5. The method for repairing the memory device of claim 4, wherein the reference storage module comprises the row repairing unit.

6. The method for repairing the memory device of claim 1, wherein after repairing the error units that are not repaired through the row address according to the result of the determination, the method further comprises:
clearing the target register.

7. The method for repairing the memory device of claim 1, wherein after repairing the error units that are not repaired through the row address according to the result of the determination, the method further comprises:
clearing all of the registers after row addresses in all of the registers are repaired.

8. The method for repairing the memory device of claim 1, wherein the method for repairing the memory device is used for repairing a memory device in which at least two of the error units appear on a same word line.

9. A system for repairing a memory device, comprising
a detection circuit, configured to perform error detection on memory units of the memory device and output unit addresses of error units, and the error units are damaged memory units;
a register circuit, electrically connected with the detection circuit and comprising a number of registers, the number being not less than a first preset number, wherein a respective one of the registers is configured to receive a unit address of each of the error units and output a row address of each of the error units, each of the error units occupies the respective one of the registers, and each of the unit addresses comprises a row address;
a control circuit, electrically connected with the registers and configured to successively select one of the registers, as a target register, in response to a number of the error units detected by the detection circuit reaching the first preset number;
a reference storage circuit, configured to store and output a repaired row address or an unrepaired row address;
a first determination circuit, electrically connected with the reference storage circuit and the register circuit, wherein the first determination circuit is configured to receive a row address output by the target register and a row address output by the reference storage circuit, to determine whether the row address in the target register exists in the reference storage circuit, and the first determination circuit is further configured to output a result of the determination; and
a repairing circuit, electrically connected with the first determination circuit, and configured to repair error units that are not repaired through the row address according to the result of the determination, wherein the control circuit comprises a first control unit and n switch units, each of the n switch units corresponding to the respective one of the registers, and n is a positive integer greater than 1;

wherein the first control unit respectively inputs control signals S1-Sn to the n switch units, wherein a control signal input by the first control unit to a kth switch unit is Sk, and k is greater than or equal to 1, or less than or equal to n; and in response to any one of the control signals S1-Sn being a high-level signal, remaining control signals are low-level signals; and wherein in response to the detection circuit detecting that the number of the error units detected by the detection circuit reaches the first preset number, the control signals S1-Sn controlled by the first control unit are successively high-level signals, and then a first switch unit to an nth switch unit are opened in order, so that each of registers corresponding to the first switch unit to the nth switch unit successively becomes the target register, the target register being connected with the first determination circuit.

10. The system for repairing the memory device of claim 9, wherein the reference storage circuit is configured to store and output the repaired row address, and the repairing circuit is further configured to skip a repair of an error unit corresponding to the target register, in response to the row address in the target register existing in the reference storage circuit.

11. The system for repairing the memory device of claim 10, wherein the first determination circuit comprises a comparator, and the comparator is configured to receive the row address output by the target register and the row address output by the reference storage circuit, and compare the row address output by the target register with the row address output by the reference storage circuit; wherein in response to the row address output by the target register being not consistent with the row address output by the reference storage circuit, a preset level signal is output to the repairing circuit to open the repairing circuit.

12. The system for repairing the memory device of claim 11, wherein the preset level signal comprises a high-level signal.

13. The system for repairing the memory device of claim 11, wherein the repairing circuit comprises a row repairing unit and a second control unit; the row repairing unit is electrically connected with the respective one of the registers and configured to perform a row address repair on the error unit corresponding to the target register; and the second control unit is electrically connected with the comparator and the row repairing unit, and configured to open/close the row repairing unit according to a high-level signal or a low-level signal output by the comparator.

14. The system for repairing the memory device of claim 13, wherein the row repairing unit comprises a second preset number of row repairing fuses, each corresponding to one redundant row address, and wherein the row repairing unit is configured to store the row address in the target register to one blank row repairing fuse of the row repairing unit.

15. The system for repairing the memory device of claim 14, wherein the reference storage circuit comprises the row repairing unit.

16. The system for repairing the memory device of claim 9, wherein the system for repairing the memory device is used for repairing a memory device in which at least two of the error units appear on a same word line.

* * * * *